United States Patent
Heo et al.

(10) Patent No.: US 9,640,399 B2
(45) Date of Patent: May 2, 2017

(54) METHODS OF FORMING PATTERNS WITH BLOCK COPOLYMER

(71) Applicant: SK hynix Inc., Gyeonggi-do (KR)

(72) Inventors: Jung Gun Heo, Daejeon (KR); Hong Ik Kim, Gyeonggi-do (KR); Keun Do Ban, Gyeonggi-do (KR); Cheol Kyu Bok, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/823,718

(22) Filed: Aug. 11, 2015

(65) Prior Publication Data

US 2016/0254154 A1    Sep. 1, 2016

(30) Foreign Application Priority Data

Feb. 27, 2015   (KR) .................. 10-2015-0028625

(51) Int. Cl.
   *H01L 21/033*   (2006.01)
   *H01L 21/324*   (2006.01)
   *H01L 21/311*   (2006.01)
   *H01L 23/544*   (2006.01)
   *G03F 7/00*   (2006.01)

(52) U.S. Cl.
   CPC ........ *H01L 21/0338* (2013.01); *G03F 7/0002* (2013.01); *H01L 21/0337* (2013.01); *H01L 21/31144* (2013.01); *H01L 23/544* (2013.01); *H01L 2223/5442* (2013.01); *H01L 2223/54426* (2013.01)

(58) Field of Classification Search
   CPC ......... H01L 21/76802; H01L 21/76816; H01L 21/0337; H01L 21/32139; H01L 27/2463; H01L 27/2409; H01L 45/1233; H01L 45/1683; H01L 21/76877; H01L 23/528; H01L 23/544; H01L 21/31144; H01L 21/0338; H01L 2223/5442; H01L 2223/54426; G02F 7/0002; G02F 7/0035
   See application file for complete search history.

(56) References Cited

U.S. PATENT DOCUMENTS 8,999,862 B1 * 4/2015 Ban .................... H01L 21/0332
                                                                  257/E21.006
2008/0311347 A1 * 12/2008 Millward ............ B81C 1/00031
                                                                  428/144

FOREIGN PATENT DOCUMENTS

KR          1020140016664          2/2014

* cited by examiner

*Primary Examiner* — Caridad Everhart
(74) *Attorney, Agent, or Firm* — IP & T Group LLP

(57) ABSTRACT

A method of forming patterns includes forming a guide pattern and first peripheral patterns on an underlying layer. The guide pattern provides first openings and the first peripheral patterns provide a fifth opening used in alignment of the guide pattern. An alignment status of the guide pattern is verified using the fifth opening. A block copolymer layer is formed to fill the first and fifth openings. The block copolymer layer is annealed to provide a blocking portion sealing the fifth opening and to form first domains in each first opening and a second domain surrounding the first domains formed in each first opening. The first domains are removed to form third openings. The underlying layer is etched using the blocking portion and sidewalls of the second domains as etch barriers to form fourth openings that extend from the third openings to penetrate the underlying layer.

19 Claims, 19 Drawing Sheets

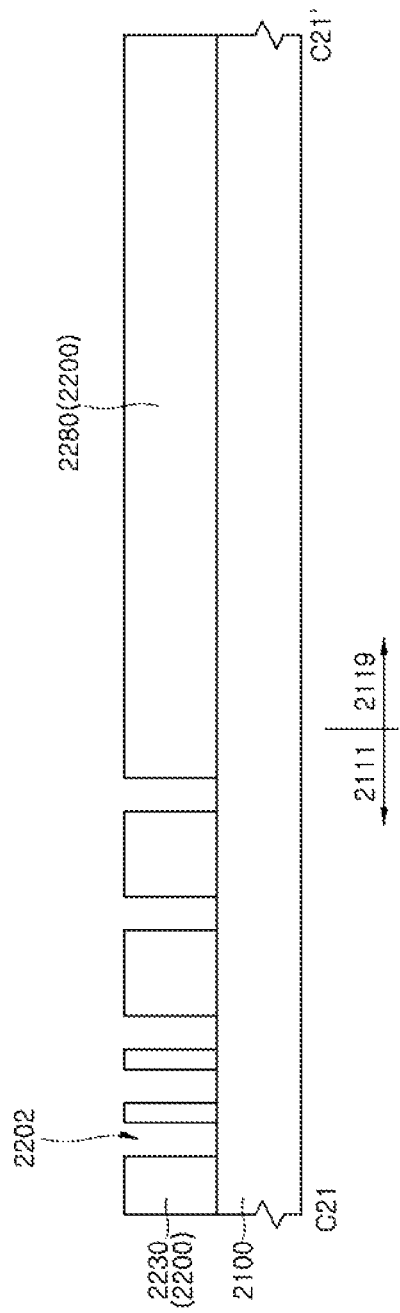

METHODS OF FORMING PATTERNS WITH BLOCK COPOLYMER

CROSS-REFERENCE TO RELATED APPLICATION

The present application claims priority under 35 U.S.C 119(a) to Korean Application No. 10-2015-0028625, filed on Feb. 27, 2015, which is herein incorporated by reference in its entirety.

BACKGROUND

1. Technical Field

Various embodiments of the present disclosure relate to methods of fabricating semiconductor devices and, more particularly, to methods of forming patterns with block copolymer materials.

2. Related Art

During fabrication of semiconductor devices, a significant amount of effort has been focused on integrating more patterns in a limited area of a semiconductor substrate. That is, attempts to increase the integration density of the semiconductor devices have typically resulted in formation of fine patterns. Various techniques have been proposed to form the fine patterns such as, forming small contact holes having a nano-scale critical dimension (CD), for example, having a size of about a few nanometers to about several tens of nanometers.

When nano-scale fine patterns of the semiconductor devices are formed using only a photolithography process, there may be some limitations in forming the fine patterns due to image resolution limits of lithography apparatuses used in the photolithography process. Methods of forming the fine patterns using self-assembly characteristics of polymer molecules may be considered as an alternative to overcome the image resolution limits of optical systems used in the photolithography process and the limits in wavelengths of lights generated from light sources of the optical systems used in the photolithography process. Recently, various techniques have been continuously developed to realize fine patterns having uniform size and shape based on self-assembly characteristics of block copolymer materials.

SUMMARY

Various embodiments are directed to methods of forming patterns. According to an embodiment, there is provided a method of forming patterns. The method includes forming a guide pattern and first peripheral patterns over an underlying layer. The guide pattern defines first openings and the first peripheral patterns define second openings. A block copolymer layer fills the first and second openings. The block copolymer layer is annealed to provide blocking portions in the second openings and to form at least one first domain and a second domain in each of the first openings. The second domain surrounds the first domain. The first domain is selectively removed to form a third opening. The underlying layer is etched using the blocking portions and the second domain as etch barrier to form a fourth opening that extends from the third opening into the underlying layer.

According to another embodiment, there is provided a method of forming patterns. The method includes forming a guide pattern and first peripheral patterns on an underlying layer. The guide pattern is formed to provide first openings, and the first peripheral patterns are formed to provide second openings and a fifth opening used in verification of an alignment status of the guide pattern. An alignment status of the guide pattern is verified using the fifth opening. A block copolymer layer is formed to fill the first, second and fifth openings. The block copolymer layer is annealed to provide blocking portions comprised of the block copolymer layer sealing the second and fifth openings and to form at least one first domain in each of the first openings and a second domain surrounding the at least one first domain formed in each of the first openings. The first domains are selectively removed to form third openings. The underlying layer is etched using the blocking portions and sidewalls of the second domains as etch barriers to form fourth openings that extend from the third openings to penetrate the underlying layer.

According to another embodiment, there is provided a method of forming patterns. The method includes forming a guide pattern and first peripheral patterns on an underlying layer. The guide pattern is formed to provide first openings to be filled with a portion of a block copolymer layer, and the first peripheral patterns are formed to provide a fifth opening used in alignment of the guide pattern and to be filled with another portion of the block copolymer layer. An alignment status of the guide pattern is verified using the fifth opening. The block copolymer layer is formed to fill the first and fifth openings. The block copolymer layer is annealed to provide a blocking portion comprised of the block copolymer layer sealing the fifth opening and to form at least one first domain in each of the first openings and a second domain surrounding the at least one first domain formed in each of the first openings. The first domains are selectively removed to form third openings. The underlying layer is etched using the blocking portion and sidewalls of the second domains as etch barriers to form fourth openings that extend from the third openings to penetrate the underlying layer.

According to another embodiment, there is provided a method of forming patterns. The method includes forming a guide pattern over a first region of an underlying layer. The guide pattern defines a first opening with a first width. A first peripheral pattern is formed over a second region of the underlying layer, wherein the first peripheral pattern defines a second opening with a second width. A block copolymer layer fills in the first and the second openings, wherein the block copolymer undergoes phase separation at a threshold width, wherein the first width is the same as or greater than the threshold width, wherein the second width is less than the threshold width. The block copolymer layer is annealed to separate the block copolymer layer in the first opening into a first domain and a second domain while incurring no phase separation of the block copolymer in the second opening, wherein the second domain surrounds the first domain. The first domain is removed to form a third opening with a third width, wherein the third width is less than the first width. The underlying layer is patterned to be exposed by the third opening using the guide pattern, the second domain, the block copolymer in the second opening, and the first peripheral pattern to form an underlying pattern. The underlying pattern has substantially the same width as the third width.

BRIEF DESCRIPTION OF THE DRAWINGS

Various embodiments of the present disclosure will become more apparent in view of the attached drawings and accompanying detailed description, in which:

FIGS. 15 to 20 are cross-sectional views illustrating a method of forming patterns according, to another embodiment.

DETAILED DESCRIPTION OF THE EMBODIMENTS

Figure 1:
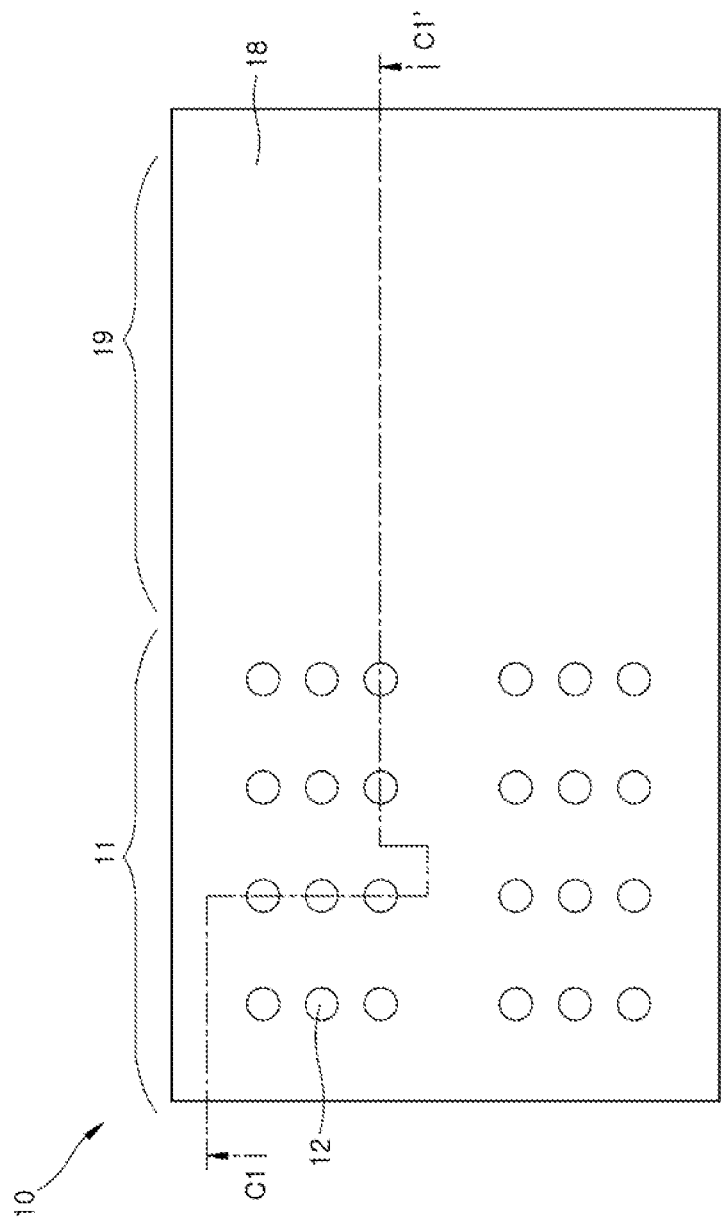
FIGS. 1, 2 and 3 are plan views illustrating a process for obtaining a layout of guide patterns used for forming patterns according to an embodiment.

It will be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present disclosure.

It will also be understood that when an element is referred to as being located "under" "beneath," "below", "lower," "on", "over", "above," "upper", "side" or "aside" another element, it can be directly contact the other element, or at least one intervening element may also be present therebetween. Accordingly, the terms such as "under", "beneath," "below", "lower," "on", "over", "above," "upper", "side" "aside" and the like which are used herein are for the purpose of describing particular embodiments only and are not intended to limit the scope of the present disclosure. Other words used to describe the relationship between elements or layers should be interpreted in a like fashion for example, "between" versus "directly between" or "adjacent" versus "directly adjacent".

In the following embodiments, the term "dense patterns" may be patterns having a relatively small pitch size and a relatively short distance therebetween. The term "peripheral patterns" may be patterns having a relatively large pitch size and a relatively long distance therebetween and disposed on a region different from a region in which the dense patterns are disposed. In addition, the term "regularly arrayed patterns" may be patterns having a uniform pitch size and substantially the same distance therebetween. The term "irregularly arrayed patterns" may be patterns having non-uniform pitch sizes or different distances therebetween. The term "irregularly arrayed patterns" may be patterns randomly arrayed.

Some embodiments of the present disclosure may provide methods of forming fine patterns having a line width less than a resolution limit of optical exposure apparatuses using a phase separation of a block copolymer (BCP) layer. Some embodiments of the present disclosure may provide methods of forming an array of contact holes or an array of cutting holes for cutting line-shaped patterns using a direct self-assembly (DSA) technique of a BCP layer. Polymer blocks constituting a BCP layer may be rearranged and phase-separated to form domain portions. The phase-separated domain portions may be selectively removed to form spaces or patterns having a nano-scale feature size. The nano-scale feature size may be a size of about a few nanometers to about several tens of nanometers.

A self-assembled structure of the BCP layer may have a cylindrical shape or a lamellar shape according to a volume ratio of two or more distinct polymer blocks constituting the BCP layer, an annealing temperature for the phase separation of the BCP layer, molecule sizes of the polymer blocks constituting the BCP layer, and molecular weights of the polymer blocks constituting the BCP layer. That is, the domain portions of the polymer blocks, which are phase-separated, may have a cylindrical shape or a lamellar shape. When the self-assembled structure of the BCP layer has a cylindrical shape, the structure may be used to form a hole array pattern. When the self-assembled structure of the BCP layer has a lamellar shape, the structure may be used to form a line and space pattern.

Various embodiments of the present disclosure may be applied to fabrication of highly integrated semiconductor devices, for example, dynamic random access memory (DRAM) devices, phase changeable random access memory (PcRAM) devices or resistive random access memory (ReRAM) devices. In addition, the embodiments may be applied to fabrication of memory devices such as static random access memory (SRAM) devices, flash memory devices, magnetic random access memory (RAM) devices or ferroelectric random access memory (FeRAM) devices. The embodiments may also be applied to fabrication of logic devices such as control devices, central processing units (CPU) or arithmetic logic units (ALU).

Figure 2:
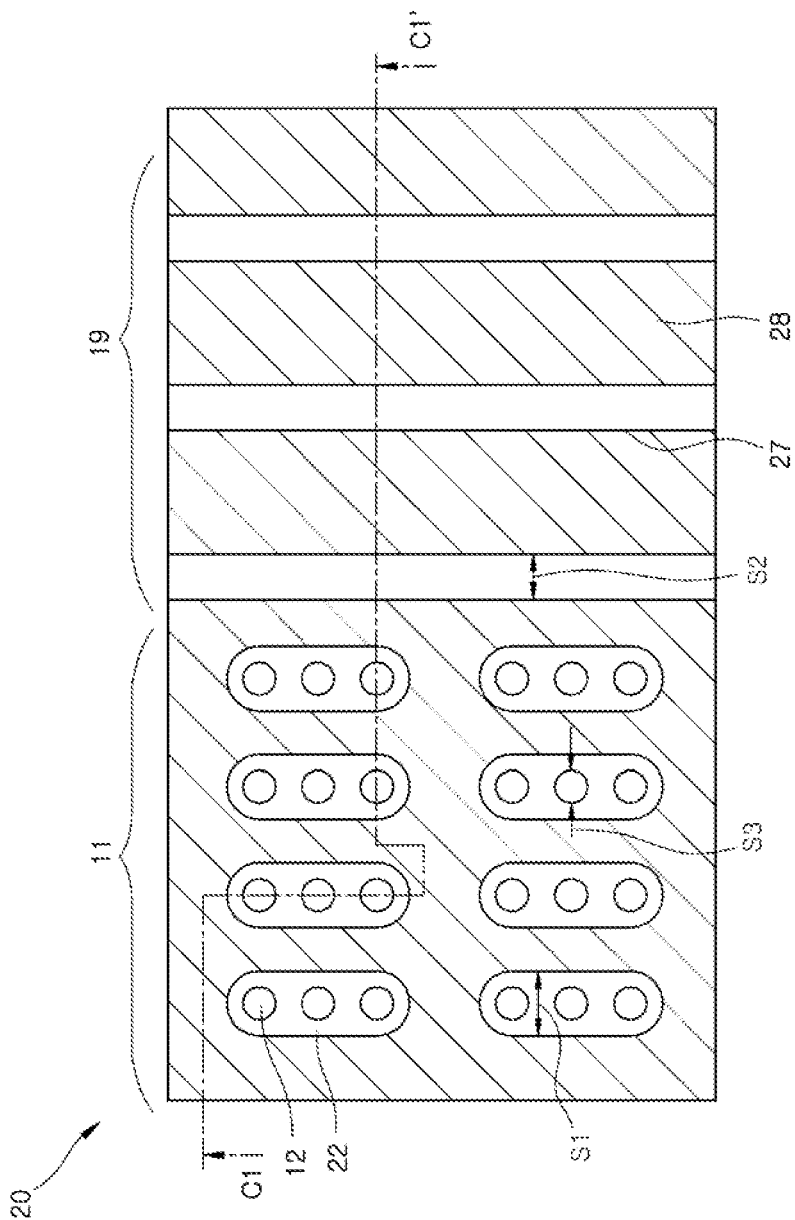
Figure 3:
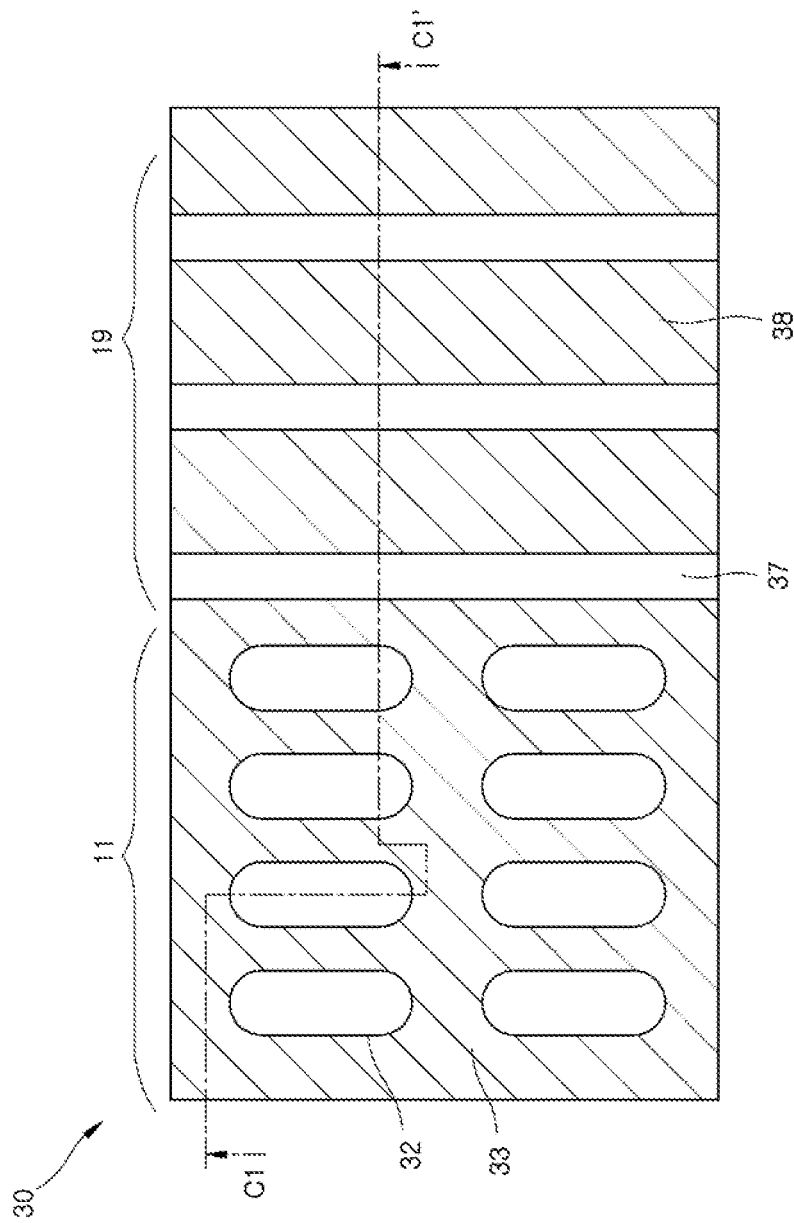

FIGS. 1, 2 and 3 are plan views illustrating a process for obtaining a layout of guide patterns used in method of forming patterns according to an embodiment.

Referring to FIG. 1, a layout 10 having target patterns may be configured to include a first region 11 and a second region 19. In the first region 11, first target patterns 12, for example, fourth opening portions are arrayed. In the second region 19, a second target pattern 18, for example, a second peripheral pattern is disposed. The second region 19 is distinct from and adjacent to the first region 11. The first region 11 may correspond to a cell region in which relatively dense patterns such as the first target patterns 12 are formed, and the second region 19 may correspond to a peripheral region in which relatively sparse line-shaped patterns or polygon-shaped patterns constituting the second target pattern 18 are formed.

Referring to FIG. 2, a layout 20 may include a plurality of first opening portions 22 serving as guide holes. Each of the first opening portions 22 may include one or more of the first target patterns (12 of FIG. 1), for example, three of the first target patterns (12 of FIG. 1). The first target patterns 12 may correspond to first domains of a phase-separated BCP material which is located in the first opening portions 22.

The layout 20 may also include the second region 19 in which second opening portions 27 and first peripheral patterns 28 are arrayed. The second opening portions 27 and the first peripheral patterns 28, in combination, may constitute the second peripheral pattern (18 of FIG. 1). A width of the second opening portions 27 may be less than a width of the first opening portions 22. For example, the second opening portions 27 may be designed to have a width S2 which is less than a width S1 of the first opening portions 22 when measured in a minor axis direction of the first opening portions 22. The second opening portions 27 may be designed so that the width S2 of the second opening portions 27 is less than 1.5 times a width S3 of the first target patterns 12 that correspond to first domains which are generated by phase separation of a BCP material. The width S1 of the first opening portions 22 may be set to provide a sufficient space for the BCP material to be fully phase-separated into at least one first domain and a second domain surrounding the at least one first domain. In contrast, the width S2 of the second opening portions 27 may be set to provide an insufficient space for each second opening portion 27 for the BCP material to undergo complete phase separation. If the width S2 of the second opening portions 27 is less than 1.5 times the width S3 of the first target patterns 12 corresponding to first domains of a fully phase separated BCP material, no complete phase separation of a BCP material occurs in the second opening portions 27 even though the BCP material is annealed. Accordingly, the second opening portions 27 may serve as dummy patterns whose images are not transferred to an underlying layer. That is, an incompletely phase-separated BCP material in each of the second opening portions 27 may function as a blocking portion that prevents pattern images of the second opening portions 27 from being transferred to an underlying layer.

Referring to FIG. 3, a guide pattern layout 30 inducing phase separation of a BCP material may include a guide pattern 33 disposed in the first region 11 to provide first opening portions 32 and first peripheral patterns 38 disposed in the second region 19 to provide second opening portions 37.

FIGS. 4 to 10 are cross-sectional views taken along lines C1-C1' of FIGS. 1, 2 and 3 to illustrate a method of forming patterns according to an embodiment.

Figure 4:
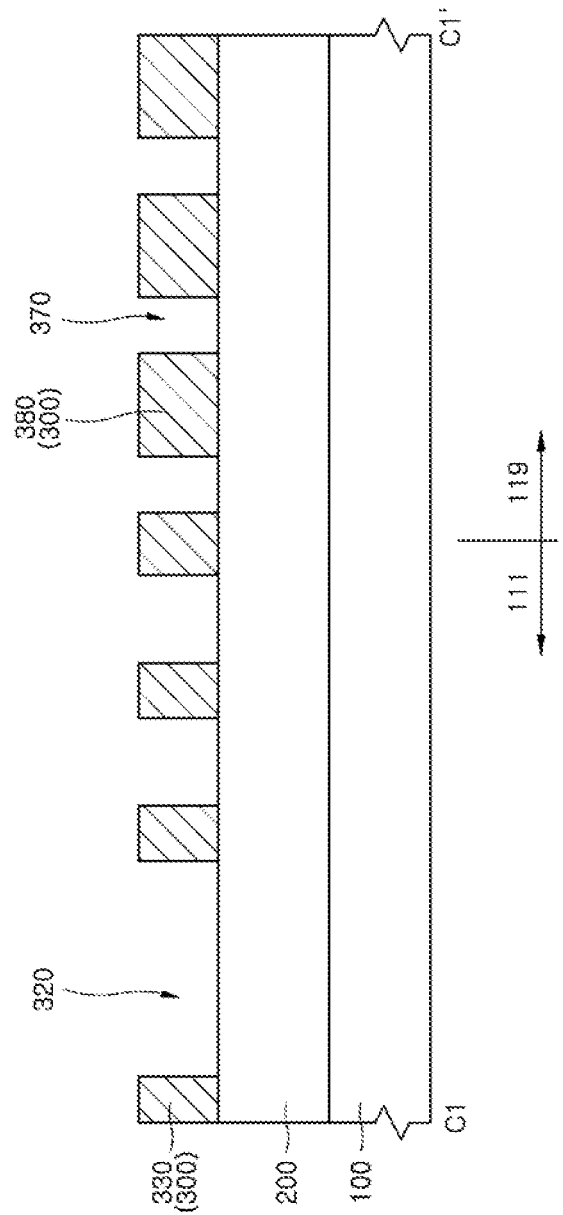
FIGS. 4 to 10 are cross-sectional views illustrating a method of forming patterns according to an embodiment.

FIG. 4 illustrates a step of forming a guide 300. Referring to FIG. 4, the guide 300 may be formed on an underlying layer 200. The guide 300 may include a guide pattern 330 that provides a plurality of first openings 370 therein and first peripheral patterns 380 that provide a plurality of second openings 370 therebetween. The guide 300 may be formed to define positions of domains which are generated while a BCP layer is phase-separated in a subsequent process. The guide 300 may be formed on a semiconductor substrate 100. In some embodiments, the underlying layer 200 may be formed on the semiconductor substrate 100, and the guide 300 may be formed on the underlying layer 200. The semiconductor substrate 100 may include a first region 111 on which the guide pattern 330 providing the first openings 320 regularly arrayed is formed and a second region 119 on which the first peripheral patterns 380 providing the second openings 370 is formed. The second region 119 may be located to be adjacent to the first region 111.

The guide 300 may be formed by coating a spin-on-carbon (SOC) material on the underlying layer 200 to a thickness of about 700 angstroms to about 800 angstroms, and by patterning the SOC layer. In some embodiments, a capping layer (not shown) may be additionally formed on the SOC layer before the SOC layer is patterned. The capping layer may be formed of a silicon oxynitride (SiON) layer having a thickness of about 300 angstroms. In some embodiments, the guide 300 may be formed to include a dielectric material such as a silicon oxide material or a silicon nitride material.

In a subsequent process, the underlying layer 200 may be patterned to form underlying patterns. In an embodiment, the underlying pattern may be used as a mask in a subsequent process. The underlying layer 200 may correspond to an etch target layer which is etched using first domains or second domains generated by phase separation of a BCP layer as etch masks in a subsequent process. The underlying layer 200 may be formed of a dielectric layer having an etch selectivity with respect to the guide 300. For example, the underlying layer 200 may be formed to include a silicon oxide layer such as a tetraethylortho silicate (TEOS) layer or a silicon oxynitride (SiON) layer having a thickness of about 300 angstroms to about 350 angstroms. In some embodiments, the underlying layer 200 may be formed of a multi-layered material including two or more of a silicon oxide layer, a polysilicon layer, and a silicon oxynitride (SiON) layer.

Figure 5:
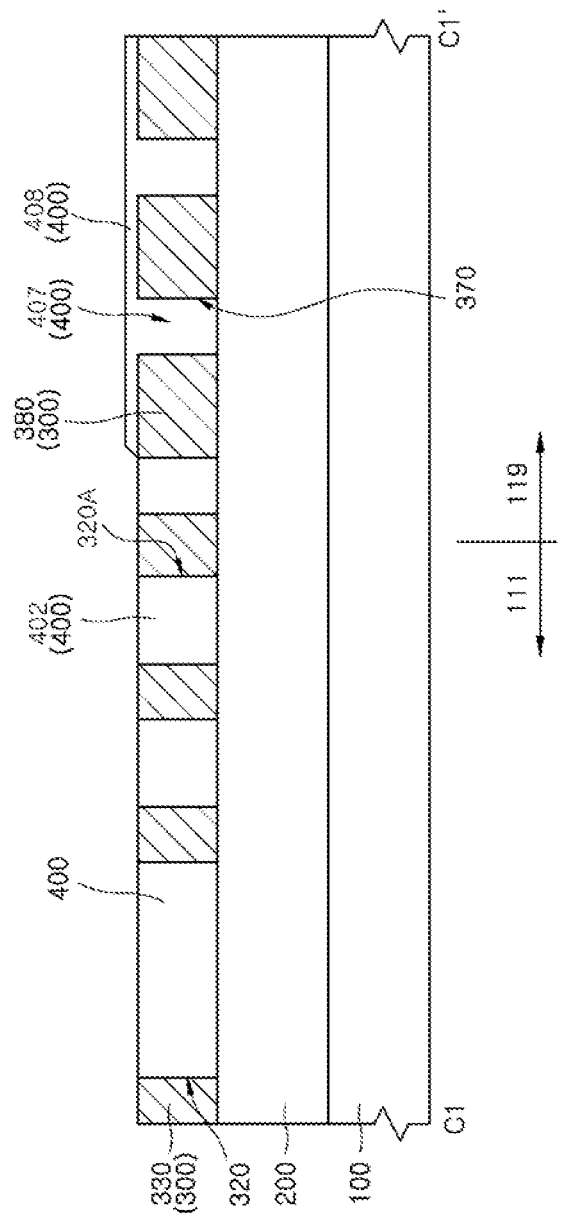

FIG. 5 illustrates a step of forming a BCP layer 400. Referring to FIG. 5, the BCP layer 400 may be coated to fill the first openings 320 and the second openings 370. Since the second openings 370 are disposed between the first peripheral patterns 380 on the second region 119 of the semiconductor substrate 100, a portion of the BCP layer 400 may flow into the second openings 370 while the BCP layer 400 is coated on the guide 300. Thus, a thickness of a portion 408 of the BCP layer 400 coated on the first peripheral patterns 380 may be reduced. As a result, a surface level difference between a portion 402 of the BCP layer 400 filling the first opening 320A adjacent to the first peripheral patterns 380 and the portion 408 of the BCP layer 400 coated on the first peripheral patterns 380 may be reduced.

If the surface level difference between the portion 402 of the BCP layer 400 filling the first opening 320A and the portion 408 of the BCP layer 400 coated on the first peripheral patterns 380 is greater than a predetermined value, the portion 408 of the BCP layer 400 coated on the first peripheral patterns 380 may flow onto the portion 402 of the BCP layer 400 filling the first opening 320A so that a surface level of the portion 402 of the BCP layer 400 filling the first opening 320A, which is located adjacent to the second region 119, becomes higher than surface levels of portions of the BCP layer 400 filling the other first openings 320. However, this may lower the surface level of the portion 408 of the BCP layer 400 coated on the first peripheral patterns 380. As a result, a uniform surface of the BCP layer 400 may be obtained without any process failures during the coating process for forming the BCP layer 400. That is, the second openings 370 contribute to leveling off or reducing the level difference of the surface of the BCP layer 400 in the first region 111 and the surface of the BCP layer 400 in the second region 119.

Figure 10:
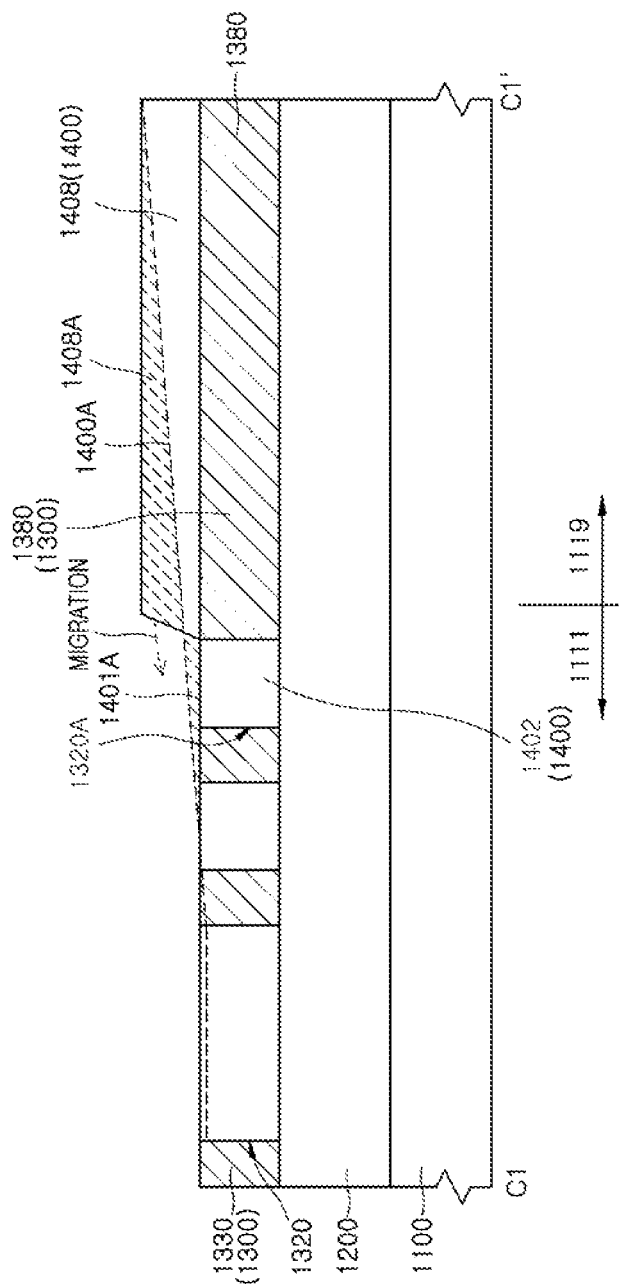

FIG. 10 illustrates a step of coating a BCP material 1400 over a peripheral pattern 1380 with no openings therein. Comparing FIGS. 5 and 10, a guide pattern 1330 of a guide 1300 has first openings 1320 therein, while the peripheral pattern 1380 of the guide 1300 has no openings therein. The guide pattern 1330 may be formed on a first region 1111 of the semiconductor substrate 1100, and the peripheral pattern 1380 may be formed on a second region 1119 of the semiconductor substrate 1100.

If a BCP layer 1400 is coated on the guide 1300, a surface level difference between a portion 1402 of the BCP layer 1400 filling the first opening 1320A adjacent to the single peripheral pattern 1380 and a portion 1408 of the BCP layer 1400 coated on the single peripheral pattern 1380 may be relatively high as compared with the example illustrated in FIG. 5 since no openings are provided in the peripheral pattern 1380. Thus, while the BCP layer 1400 is coated on the guide 1300, a portion 1408A of the BCP layer 1400 on the peripheral pattern 1380 may flow or migrate onto the portion 1402 of the BCP layer 1400 filling the first opening 1320A to form a migrated portion 1401A of the BCP layer 1400. As a result, the BCP layer 1400 may be coated on the guide 1300 so that a final portion 1400A of the BCP layer 1400 remaining on the peripheral pattern 1380 is formed to have a sloped top surface which is higher towards an edge of the semiconductor substrate 1100.

Since the migrated portion 1401A of the BCP layer 1400 is accumulated on the portion 1402 of the BCP layer 1400 filling the first opening 1320A, a total thickness of the BCP layer 1400 disposed in and on the first opening 1320A, which is located adjacent to the second region 119, may be greater than a thickness of portions of the BCP layer 1400 filling the other first openings 1320. In such a case, domains of the BCP layer 1400 generated in the first openings 1320 and in the first openings 1320A by phase separation of the BCP layer 1400 may have different sizes from each other. That is, it may be difficult to form uniform domains corresponding to the first target patterns (12 of FIG. 1) in each of the first openings 1320 and 1320A.

However, according to the embodiment, the first peripheral patterns 380 may be formed on the second region 119 of the semiconductor substrate 100 to provide the second openings (370 of FIG. 5) in which the portion 1408 of the BCP layer 1400 fills. Thus, the BCP layer 400 may be uniformly coated due to the presence of the second openings 370. Accordingly, the second openings 370 may serve as dummy patterns that prevent or suppress non-uniformity of the BCP layer 400.

Referring back to FIG. 5, the BCP layer 400 may include a polystyrene-poly(meta methyl acrylate) block copolymer (PS-b-PMMA) material or a polystyrene-poly(di methyl siloxane) (PS-PDMS) block copolymer material. In the event that the BCP layer 400 is formed of a PS-b-PMMA material including PS blocks and PMMA blocks, a volume ratio of the PS blocks to the PMMA blocks may be controlled to be within the range of about 7:3 to about 5:5. The volume ratio of the PS blocks to the PMMA blocks or molecular weights of the PS block and the PMMA block may be appropriately controlled according a process scheme. For example, the PS-b-PMMA material may have PS block units of about 60 vol. % to about 80 vol. % and PMMA block units of about 20 vol. % to about 40 vol. %.

The BCP layer 400 may be a functional polymer material. In the BCP layer 400, two or more distinct polymer blocks or units are combined with each other by a covalent bond to constitute the block copolymer material, as illustrated in FIG. 11.

Figure 11:
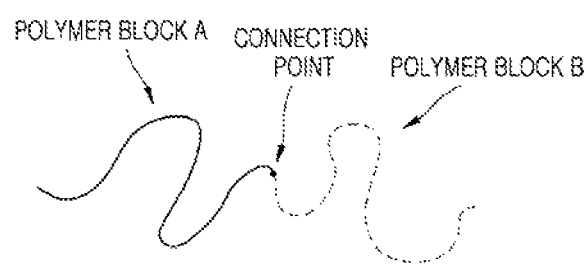
FIGS. 11, 12 and 13 are schematic views illustrating phase separations of block copolymer (BCP) layers used in some embodiments.
Figure 12:
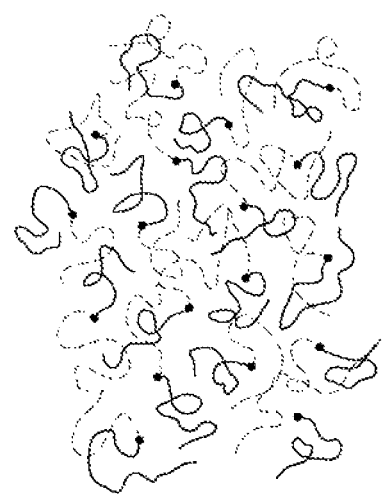
Figure 13:
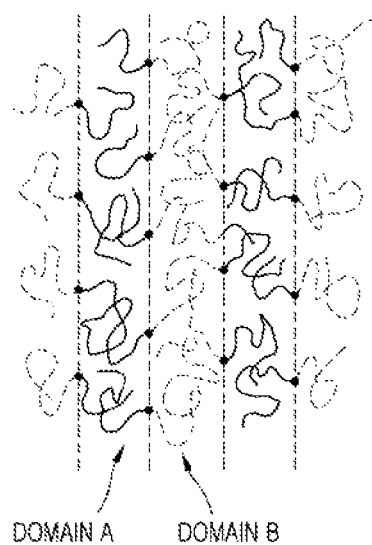

FIGS. 11, 12 and 13 are schematic views illustrating phase separations of BCP layers used in some embodiments. As illustrated in FIG. 11, the BCP layer 400 may have a chain shape in which a polymer block 'A' and a polymer block 'B' are connected to each other by a covalent bond. The BCP layer 400 may be coated to have a homogeneous phase, as illustrated in FIG. 12. The polymer blocks having distinct structures in the BCP layer 400 may have different miscibility and different solubility from each other due to a difference between chemical structures thereof. That is, the polymer blocks having distinct structures are immiscible with each other at a certain temperature. Thus, the BCP layer 400 may be phase-separated by an annealing process to provide a self-aligned structure, as illustrated in FIG. 13. For example, the BCP layer 400 having a homogeneous phase may be phase-separated into a domain 'A' composed of the polymer blocks 'A' and a domain composed of the polymer blocks 'B', by an annealing process. As such, polymer blocks of the BCP layer 400 may be phase-separated and then selectively dissolved in a liquid state or in a solid state to form a self-assembled structure.

Forming a nano-scale structure having a specific shape through a self-assembly of the BCP layer 400 may be influenced by a physical property and/or a chemical property of the polymer blocks of the BCP layer 400. When a BCP layer consisting of two distinct polymer blocks is self-assembled on a substrate, the self-assembled structure of the BCP layer may be formed to have a three dimensional cubic shape, a three dimensional double helix shape, a two dimensional hexagonal packed column shape, or a two dimensional lamella shape according to a volume ratio & the polymer blocks constituting the BCP layer, an annealing temperature for phase separation of the BCP layer, and molecule sizes of the polymer block constituting the BCP layer.

In some embodiments, the BCP layer 400 may include polybutadiene-polybutylmethacrylate block copolymer, polybutadiene-polydimethylsiloxane block copolymer, polybutadiene-polymethylmethacrylate block copolymer, polybutadienepolyvinylpyridine block copolymer, polybutylacrylate-polymethylmethacrylate block copolymer, polybutylacrylate-polyvinylpyridine block copolymer, polyisoprene-polyvinylpyridine block copolymer, polyisoprene-polymethymethylacyrylate block copolymer, polyhexylacrylatepolyvinylpyridine block copolymer, polyisobutylene-polybutylmethacrylate block copolymer, polyisobutylene-polymethylmethacrylate block copolymer, polyisobutylene-polybutylmethacrylate block copolymer, polyisobutylenepolydimethylsiloxane block copolymer, polybutylmethacrylatepolybutylacrylate block copolymer, polyethylethylene-polymethylmethacrylate block copolymer, polystyrene-polybutylmethacrylate block copolymer, polystyrene-polybutadiene block copolymer polystyrene-polyisoprene block copolymer, polystyrene-polydimethylsiloxane block copolymer, polystyrene-polyvinylpyridine block copolymer, polyethylethylene-polyvinylpyridine block copolymer, polyethylene-polyvinylpyridine block copolymer, polyvinylpyridinepolymethylmethacrylate block copolymer, polyethyleneoxidewpolyisoprene block copolymer, polyethyleneoxidew polybutadiene block copolymer, polyethyleneoxidewpolystyrene block copolymer, polyethyleneoxidepolyrnethylmethacrylate block copolymer, polyethyleneoxide-polydimethylsiloxane block copolymer, polystyrene-polyethyleneoxide block copolymer, or a combination thereof.

Figure 6:
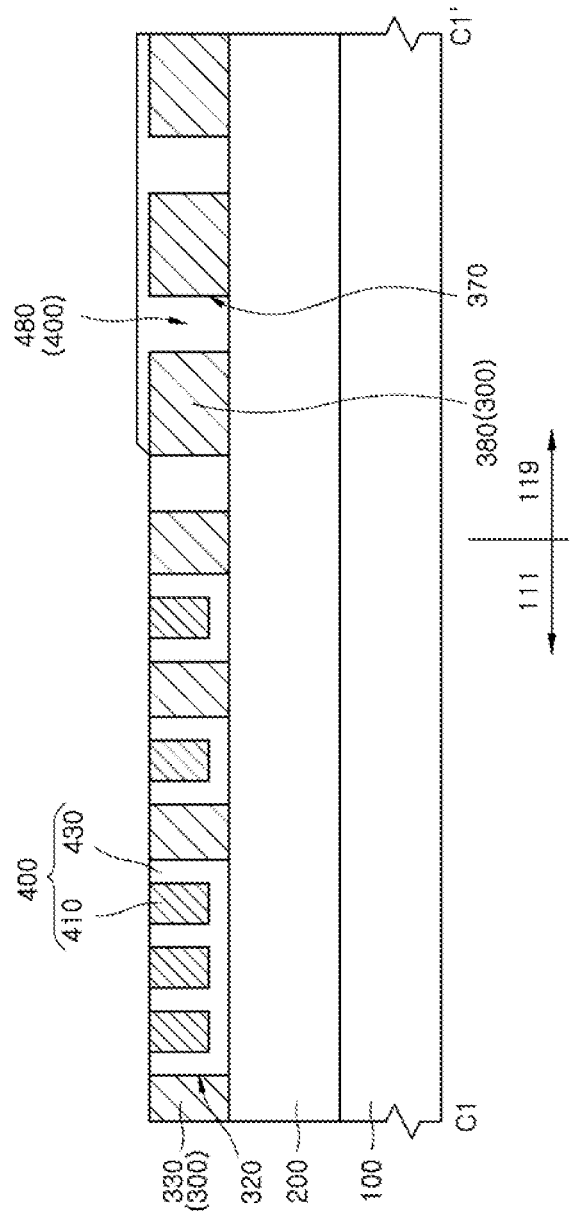

FIG. 6 illustrates a step of phase-separating the BCP layer 400. Referring to FIG. 6, the BCP layer 400 may be phase-separated using an annealing process to form first domains 410 located in each of the first openings 320 and a second domain 430 surrounding the first domains 410 and formed in each of the first openings 320. The second domain 430 may be formed to have a concave shape that surrounds sidewalls and bottom surfaces of the first domains 410 in each of the first openings 320.

The BCP layer 400 remaining in the second openings 370 is not phase-separated and thus serves as blocking portions 480. The blocking portions 480 may be provided to seal the second openings 370, respectively. Since each of the second openings 370 is designed to have an insufficient space for phase separation of a BCP material to occur, the portions (407 of FIG. 5) of the BCP layer 400 in the second openings 370 are not phase-separated and remain as are even after the BCP layer 400 is annealed.

For example, the second openings 370 may be formed so that a width (corresponding to the width S2 of FIG. 2) of the second openings 370 is less than 1.5 times a width (corresponding to the width S3 of FIG. 2) of the first domains 410. Therefore, phase separation of the BCP layer 400 may be suppressed in the second openings 370. As a result, while the BCP layer 400 is annealed, the phase separation of the BCP layer 400 may occur only in the first openings 320 to form the first and second domains 410 and 430 in the first openings 320.

The phase separation of the BCP layer 400 may be achieved by annealing the BCP layer 400 at a temperature exceeding a glass transition temperature Tg of the BCP layer 400 to rearrange the polymer blocks of the BCP layer 400. For example, the BCP layer 400 may be annealed at a temperature of about 100 degrees Celsius to about 300 degrees Celsius for about six minutes to about twenty four hours to rearrange the polymer blocks of the BCP layer 400.

Figure 7:
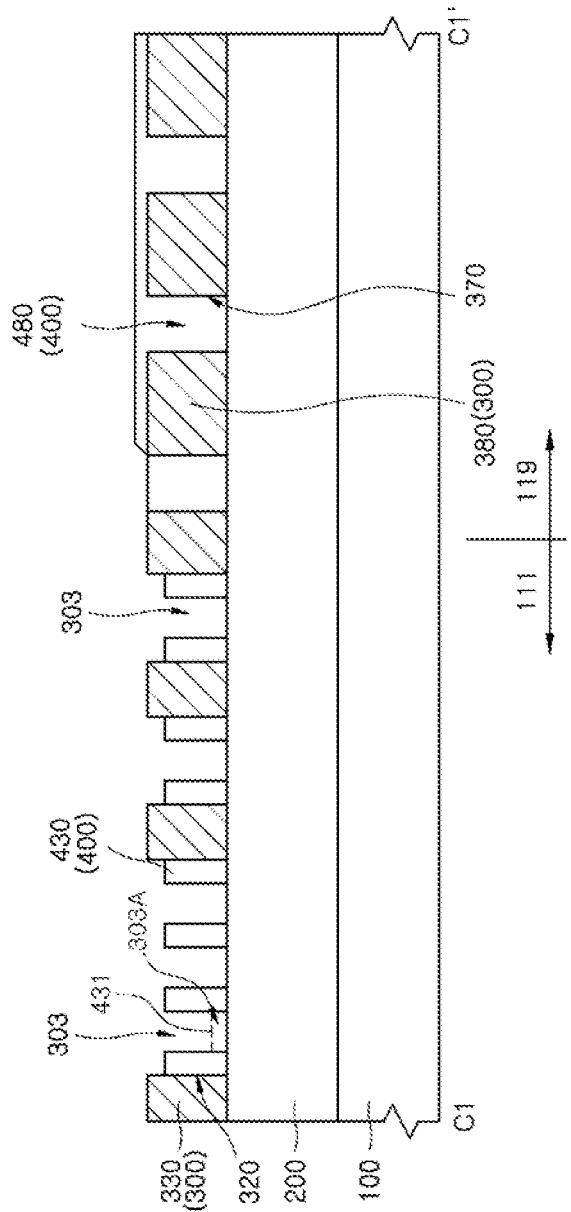

FIG. 7 illustrates a step of forming third openings 303 and third opening extensions 303A. Referring to FIG. 7, the first domains (410 of FIG. 6) may be selectively removed to form third openings 303 in each of the first openings 320. The first domains 410 may be selectively removed using an etch process that employs the second domains 430 and the blocking portions 480 as etch barriers. Bottom portions 431 of the second domains 430 exposed by the third openings 303 may be removed to form the third opening extensions 303A that expose portions of the underlying layer 200. While the first domains 410 are selectively removed, no opening is formed in the second openings 370 due to the presence of the blocking portions 480.

Figure 8:
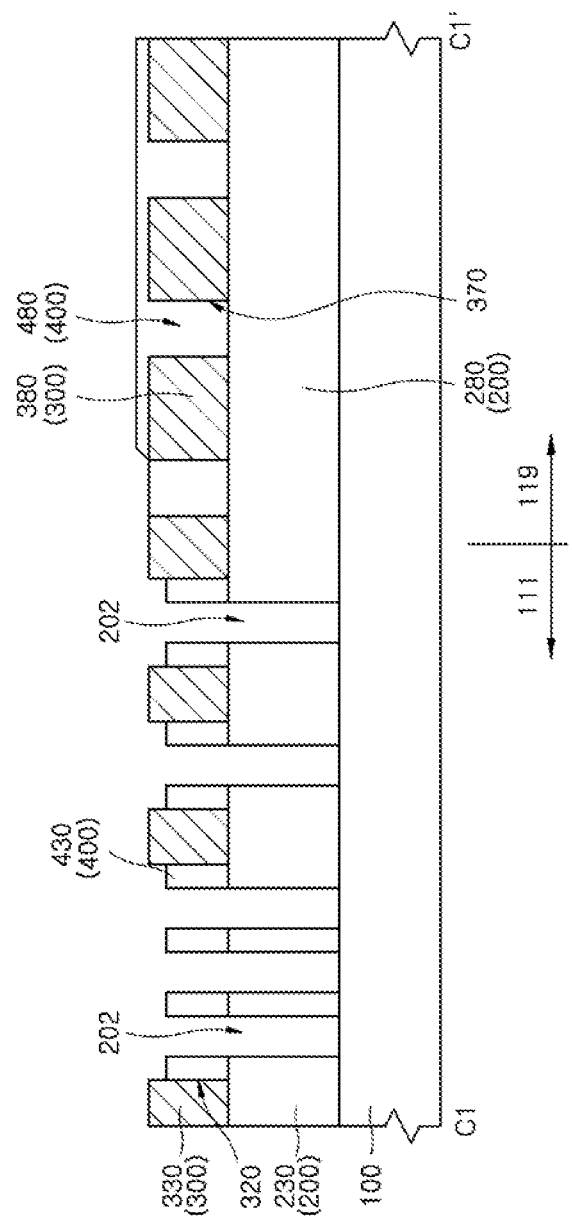

FIG. 8 illustrates a step of forming fourth openings 202. Referring to FIG. 8, the portions of the underlying layer 200 exposed by the third opening extensions 303A (shown in FIG. 7) may be etched using the second domains 430 and the guide pattern 330 as etch masks, thereby forming the fourth openings 202 that penetrate the underlying layer 200. As a result, a first underlying pattern 230 providing the fourth openings 202 may be formed on the first region 111 of the semiconductor substrate 100, and a second underlying pattern 280 having no openings may be formed on the second region 119 of the semiconductor substrate 100. While the fourth openings 202 are formed, pattern shapes of the second openings 370 may not be transferred to the underlying layer 200 due to the presence of the blocking portions 480. As such, the second openings 370 may serve as dummy patterns whose shapes are not transferred to the underlying layer 200.

Figure 9:
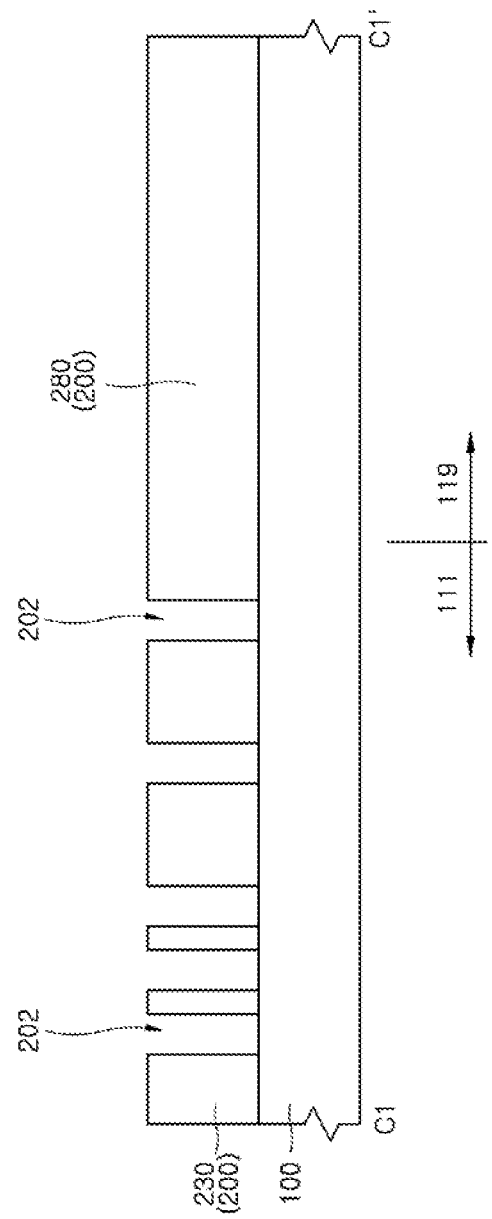

FIG. 9 illustrates a structure including the fourth openings 202. Referring to FIG. 9, the guide pattern 330, the first peripheral patterns 380, the blocking portions 480, and the second domains 430 may be removed to expose top surfaces of the first underlying pattern 230 and the second underlying pattern 280.

Figure 14:
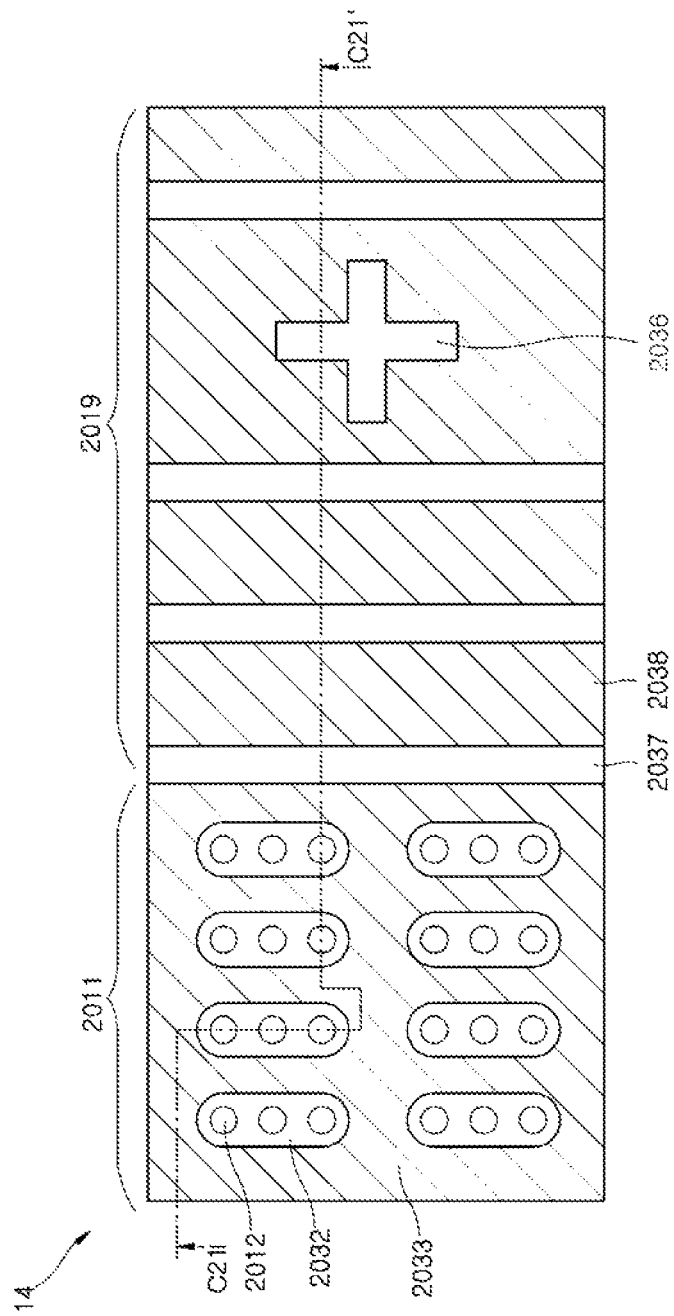
FIG. 14 is a plan view illustrating a layout of guide patterns used for forming patterns according to another embodiment.

FIG. 14 is a plan view illustrating a layout 14 of guide patterns used in a method of forming patterns according to another embodiment, Referring to FIG. 14, the layout 14 may include a guide pattern 2033 that provides a plurality of first opening portions 2032, each of which is designed to accommodate at least one first target pattern 2012, for example, three first target patterns 2012. The guide pattern 2033 may be disposed in a first region 2011 of a semiconductor substrate in a plan view. The layout 14 may further include first peripheral pattern portions 2038 that provide second opening portions 2037 disposed therebetween and a fifth opening portion 2036.

The fifth opening portion 2036 may serve as an overlay key or an alignment key. The first peripheral pattern portions 2038 and the second opening portions 2037 may be disposed in a second region 2019 of the semiconductor substrate in a plan view. The first peripheral pattern portions 2038, the second opening portions 2037, and the fifth opening portion 2036 may constitute a second peripheral pattern.

The second opening portions 2037 and the fifth opening portion 2036 may be designed to have widths which are less than a width of the first opening portions 2032. For example, the second opening portions 2037 and the fifth opening portion 2036 may be designed to have widths which are less than a width of the first opening portions 2032 in a minor axis direction thereof. The second opening portions 2037 and the fifth opening portion 2036 may be designed so that the widths of the second opening portions 2037 and the fifth opening portion 2036 are less than 1.5 times the width of the first target patterns 2012.

The width of the first opening portions 2032 may be set to provide a sufficient space for the BCP material in the first openings 2032 to be fully phase-separated into the first domain in a center and the second domain surrounding the first domain.

In contrast, the width of the second opening portions 2037 may be set to provide an insufficient space for the BCP material in the second opening portion 2037 to be completely phase separated. Accordingly, the second opening portions 2037 and the fifth opening portion 2036 may serve as dummy patterns whose images are not transferred to an underlying layer. That is, an incompletely phase-separated BCP material in each of the second opening portions 2037 and the fifth opening portion 2036 may function as a blocking portion that prevents pattern images of the second opening portions 2037 and the fifth opening portion 2036 from being transferred to an underlying layer. The second opening portions 2037, the fifth opening portion 2036 and the first peripheral pattern portions 2038, as combined, may form the second peripheral pattern portion.

Figure 15:
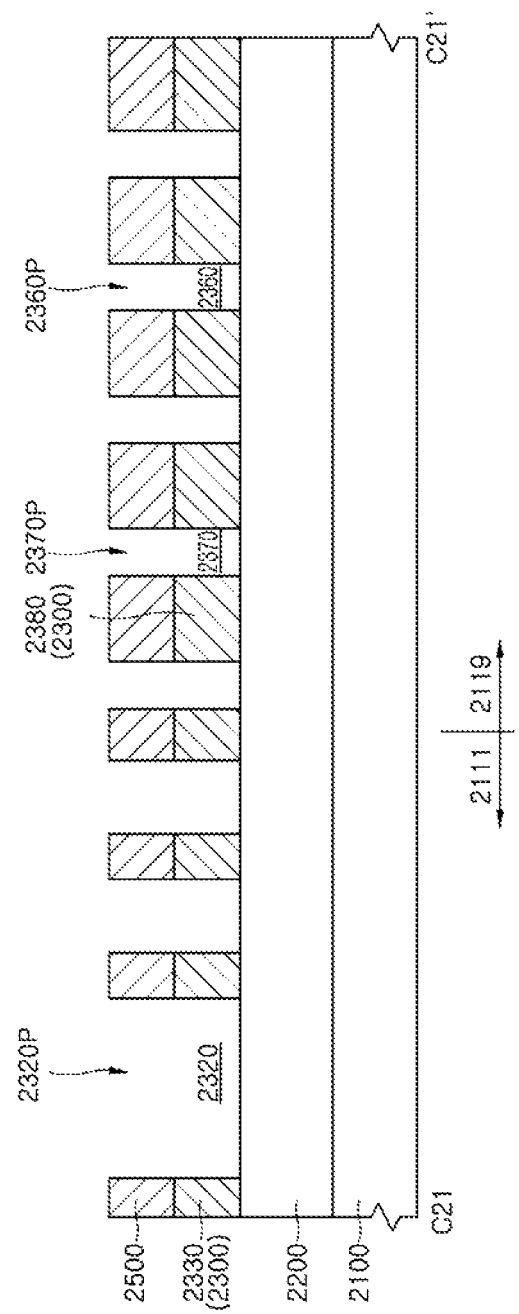

FIGS. 15 to 20 are cross-sectional views taken along a line C21-C21' of FIG. 14 to illustrate a method of forming patterns according to another embodiment. FIG. 15 illustrates a step of forming a guide 2300. Referring to FIG. 15, a guide 2300 may be formed on an underlying layer 2200. The guide 2300 may be formed to include a guide pattern 2330 that provides first openings 2320 and first peripheral patterns 2380 that provide second openings 2370 and a fifth opening 2360. Specifically, a guide layer may be formed on the underlying layer 2200, and an etch mask 2500 may be formed on the guide layer. The guide layer may then be etched using the etch mask 2500 as an etch barrier to form the first openings 2320, the second openings 2370, and the fifth opening 2360.

The etch mask 2500 may be formed of a photoresist material and may be used as an etch barrier during an etch process for forming the first and second openings 2320 and 2370 and the fifth opening 2360. The etch mask 2500 may be formed to include sixth openings 2320P that define the first openings 2320, seventh openings 2370P that define the second openings 2370, and an eighth opening 2360P that defines the fifth opening 2360. The etch mask 2500 may be formed using a photolithography process including an exposure step and a development step.

The eighth opening 2360P may be formed to define a shape of the fifth opening 2360. The eighth opening 230P or the fifth opening 2360 may be used to verify an alignment status between the etch mask 2500 and underlying pattern (not shown) on the substrate 2100. For example, the eighth opening 2360P or the fifth opening 2360 may be used as an overlay key for verifying or confirming an alignment status between the etch mask 2500 (or guide 2300) and a semiconductor substrate 2100 below the underlying layer 2200. Alternatively, the eighth opening 2360P (or the fifth opening 2360) may be used as an alignment key for verifying or confirming an alignment status of the semiconductor substrate 2100 in an wafer processing apparatus such as an exposure apparatus.

The guide 2300 may be formed to induce and define positions of domains which are generated while a BCP layer is phase-separated in a subsequent process. The guide 2300 may be formed on the semiconductor substrate 2100. The semiconductor substrate 2100 may include a first region 2111 in which the first target patterns (2012 of FIG. 14) are densely and regularly located in the first openings 2320 and a second region 2119 in which the second openings 2370 and the fifth opening 2360 provided by the first peripheral patterns 2380 are disposed. The first region 2111 may be adjacent to and distinct from the second region 2119.

The guide 2300 may be formed by coating a spin-on-carbon (SOC) material on the underlying layer 2200, by curing the SOC material to form an SOC layer having a thickness of about 700 angstroms to about 800 angstroms, and by patterning the SOC layer. In some embodiments, a capping layer (not shown) may be additionally formed on the SOC layer before the SOC layer is patterned. The capping layer may be formed of a silicon oxynitride (SiON) layer having a thickness of about 300 angstroms. In some embodiments, the guide 2300 may be formed to include a dielectric material such as a silicon oxide material or a silicon nitride material.

In a subsequent process, the underlying layer 2200 may be patterned to form underlying patterns. The underlying patterns may be used as a hard mask. The underlying layer 2200 may correspond to an etch target layer which is etched using first domains or second domains generated by phase separation of a BCP layer as etch masks in a subsequent process.

The underlying layer 2200 may be formed of a dielectric layer having an etch selectivity with respect to the guide 2300. For example, the underlying layer 2200 may be formed to include a silicon oxide layer such as a tetraethylortho silicate (TEOS) layer or a silicon oxynitride (SiON) layer and may have a thickness of about 300 angstroms to about 350 angstroms. In some embodiments, the underlying layer 2200 may be a multi-layered material including a silicon oxide layer, a polysilicon layer, a silicon oxynitride (SiON) layer, or a combination thereof. After the first openings 2320, the second openings 2370 and the fifth opening 2360 are formed, then the etch mask 2500 may be removed.

Figure 16:
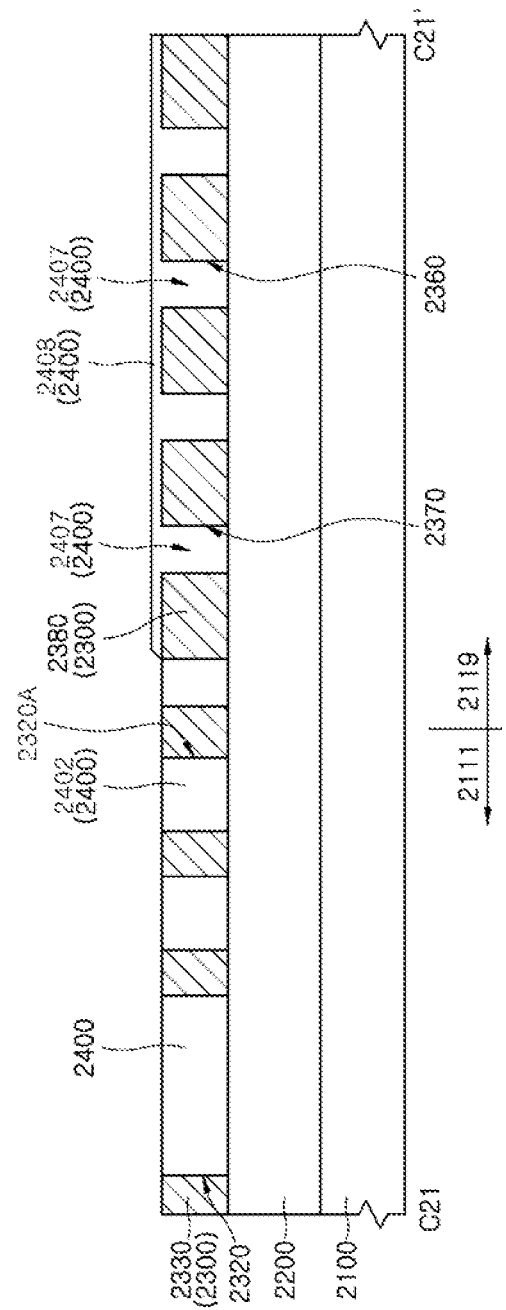

FIG. 16 illustrates a step of forming a BCP layer 2400. Referring to FIG. 16, the BCP layer 2400 may be coated to fill the first openings 2320, the second openings 2370, and the fifth 2360. Since the second openings 2370 are disposed between the first peripheral patterns 2380 and the fifth opening 2360 is disposed in the first peripheral patterns 2380 on the second region 2119 of the semiconductor substrate 2100, a portion of the BCP layer 2400 may flow into the second openings 2370 and the fifth opening 2360 while the BCP layer 2400 is coated on the guide 2300. Thus, a thickness of a portion 2408 of the BCP layer 2400 coated on the first peripheral patterns 2380 may be reduced.

As a result, a surface level difference between a portion 2402 of the BCP layer 2400 filling the first opening 2320A adjacent to the first peripheral patterns 2380 and the portion 2408 of the BCP layer 2400 coated on the first peripheral patterns 2380 may be reduced. That is, the second openings 2370 and the fifth opening 2360 may provide spaces into which the portion of the BCP layer 2400 flows. Thus, a uniform surface of the BCP layer 2400 may be obtained during the coating process for forming the BCP layer 2400.

Figure 17:
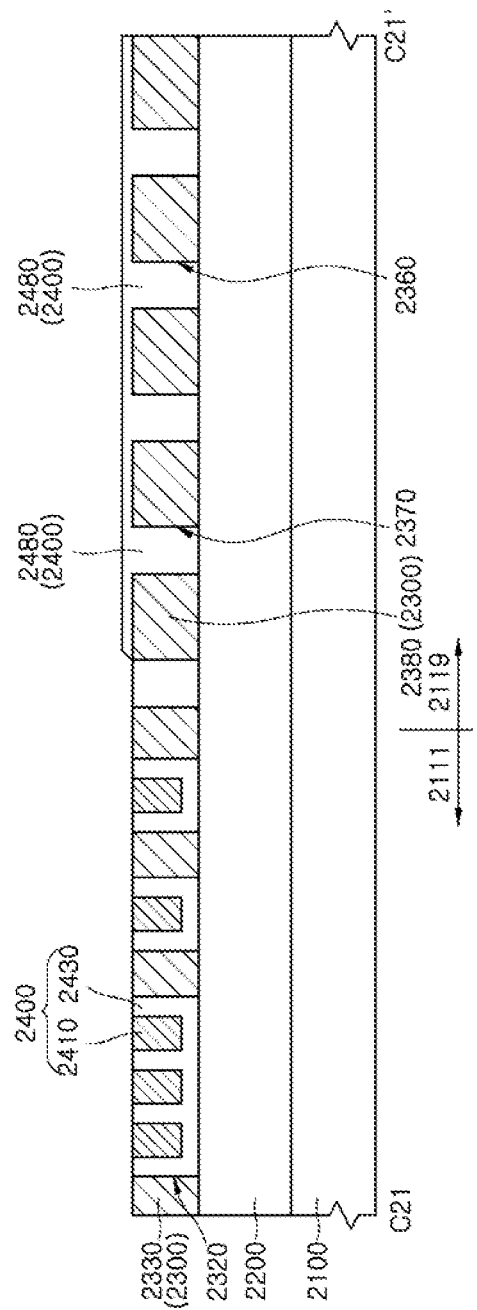

FIG. 17 illustrates a step of phase-separating the BCP layer 2400. Referring to FIG. 17, the BCP layer 2400 may be phase-separated in the course of an annealing process to form first domains 2410 located in each of the first openings 2320 and a second domain 2430 surrounding the first domains 2410 and formed in each of the first openings 2320. In such a case, the portions (2407 of FIG. 16) of the BCP layer 2400 remaining in the second openings 2370 and the fifth opening 2360 are not phase-separated, thereby serving as blocking portions 2480.

The blocking portions 2480 may be provided to seal the second and fifth openings 2370 and 2360, respectively. Since each of the second and the fifth openings 2370 and 2360 are designed to have an insufficient space for phase separation of a BCP material to occur, the portions (2407 of FIG. 16) of the BCP layer 2400 in the second and fifth openings 2370 and 2360 are not phase-separated and still include polymeric components which are randomly arrayed even after the BCP layer 2400 is annealed. For example, the second and fifth openings 2370 and 2360 may be formed so that widths of the second and fifth openings 2370 and 2360 are less than 1.5 times a width of the first domains 2410 corresponding to the first target patterns (2012 of FIG. 14). Thus, phase separation of the BCP layer 2400 may be suppressed in the second and fifth openings 2370 and 2360. As a result, while the BCP layer 2400 is annealed, the phase separation of the BCP layer 2400 may occur only in the first openings 2320 to induce formation of the first and second domains 2410 and 2430, in the first openings 2320.

The phase separation of the BCP layer 2400 may be achieved by annealing the BCP layer 2400 at a temperature exceeding a glass transition temperature Tg of the BCP layer 2400 to rearrange the polymer blocks of the BCP layer 2400. For example, the BCP layer 2400 may be annealed at a temperature of about 100 degrees Celsius to about 300 degrees Celsius for about six minutes to about twenty four hours to rearrange the polymer blocks of the BCP layer 2400.

Figure 18:
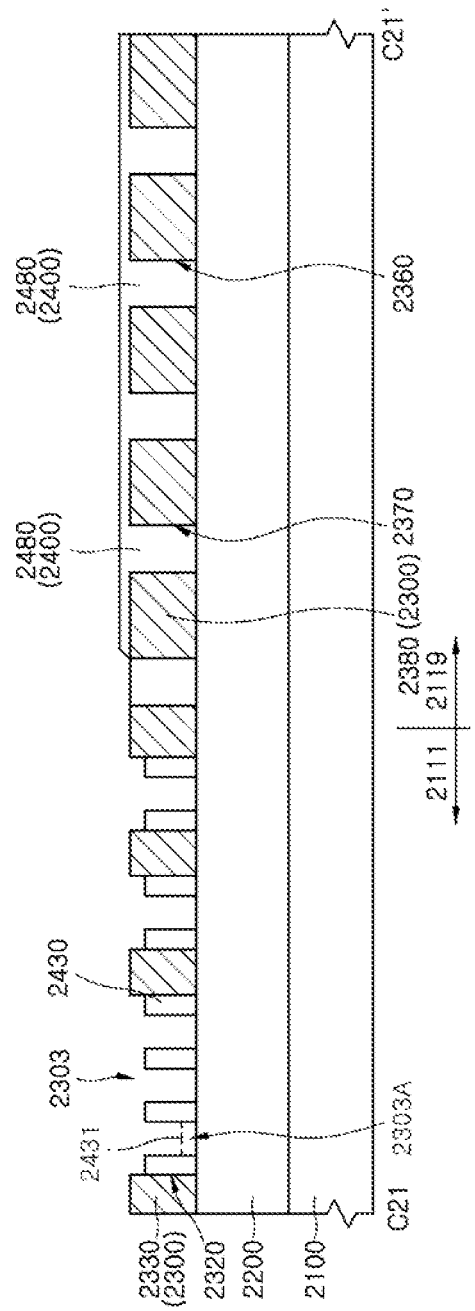

FIG. 18 illustrates a step of forming third openings 2303 and third opening extensions 2303A. Referring to FIG. 18, the first domains (2410 of FIG. 17) may be selectively removed to form one or more third openings 2303 in each of the first openings 2320. The first domains 2410 may be selectively removed using an etch process that employs the second domains 2430 and the blocking portions 2480 as etch barriers. Bottom portions 2431 of the second domains 2430 exposed by the third openings 2303 may be removed to form the third opening extensions 2303A that expose portions of the underlying layer 2200. While the first domains 2410 are selectively removed, no openings are formed in the second and fifth openings 2370 and 2360 due to the BCP layer 2400 filling in the second and fifth openings 2370 and 2360 serving as the blocking portions 2480.

Figure 19:
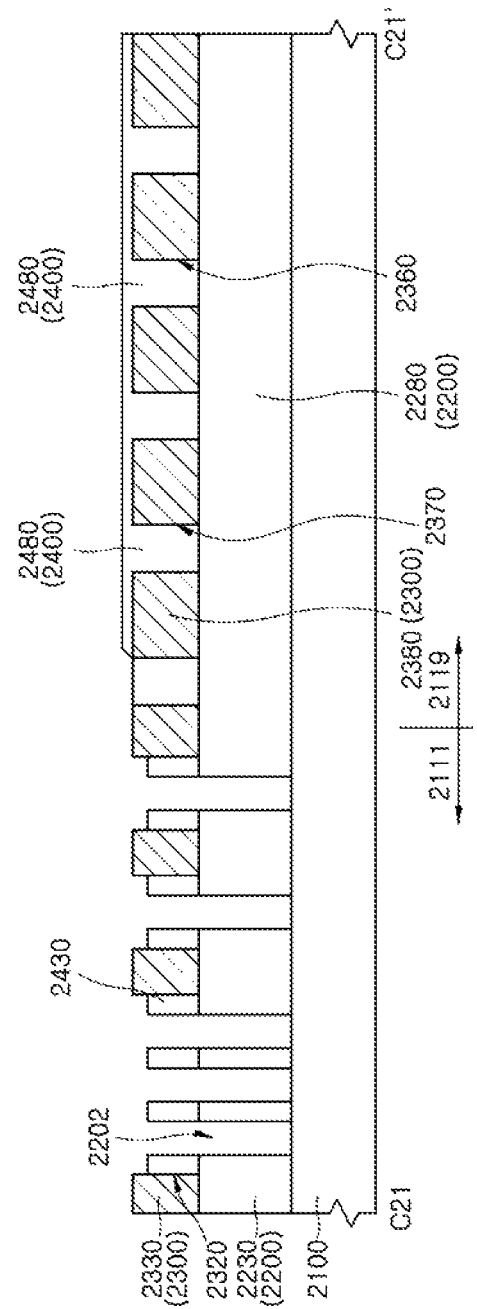

FIG. 19 illustrates a step of forming fourth openings 2202. Referring to FIG. 19, the portions of the underlying layer 2200 exposed by the third opening extensions 2303A may be etched using the second domains 2430 and the guide pattern 2330 as etch masks, thereby forming the fourth openings 2202 that penetrate the underlying layer 2200. As a result, a first underlying, pattern 2230 providing the fourth openings 2202 may be formed on the first region 2111 of the semiconductor substrate 2100, and a second underlying pattern 2280 having no openings may be formed on the second region 2119 of the semiconductor substrate 2100. While the fourth openings 2202 are formed, pattern shapes of the second and fifth openings 2370 and 2360 may not be transferred to the underlying layer 2200 due to the presence of the blocking portions 2480. As such, the second and fifth openings 2370 and 2360 may serve as dummy patterns whose shapes are not transferred to the underlying layer 2200.

FIG. 20 illustrates a structure including the fourth openings 2202. Referring to FIG. 20, the guide pattern 2330, the first peripheral patterns 2380, the blocking portions 2480, and the second domains 2430 may be removed to expose top surfaces of the first underlying pattern 2230 and the second underlying pattern 2280.

According to the embodiments described above, nano-scale structures or nano structures can be fabricated on a large-sized substrate using a phase separation technique of a BCP layer. The nano-scale structures may be used in fabrication of polarizing plates or in formation of reflective lens of reflective liquid crystal display (LCD) units. The nano structures may also be used in fabrication of separate polarizing plates as well as in formation of polarizing parts including display panels. For example, the nano structures may be used in fabrication of array substrates including thin film transistors or in processes for directly forming the polarizing parts on color filter substrates. Further, the nano structures may be used in molding processes for fabricating nanowire transistors or memories, molding processes for fabricating electronic/electric components such as nano-scaled interconnections, molding process for fabricating catalysts of solar cells and fuel cells, molding process for fabricating etch masks and organic light emitting diodes (OLEDs), and molding process for fabricating gas sensors.

The methods according to the aforementioned embodiments and structures formed thereby may be used in fabrication of integrated circuit (IC) chips. The IC chips may be supplied to users in a raw wafer form, in a bare die form, or in a package form. The IC chips may also be supplied in a single package form or in a multi-chip package form. The IC chips may be integrated in intermediate products such as mother boards or end products to constitute signal processing devices. The end products may include toys, low end application products, or high end application products such as computers. For example, the end products may include display units, keyboards, or central processing units (CPUs).

What is claimed is:

1. A method of forming patterns, the method comprising:
   forming a guide pattern and first peripheral patterns over an underlying layer, the guide pattern defining first openings, the first peripheral patterns defining second openings;
   forming a block copolymer layer filling the first and second openings;
   annealing the block copolymer layer to provide blocking portions in the second openings and to form at least one first domain and a second domain in each of the first openings, wherein the second domain surrounds the first domain;
   selectively removing the first domain to form third openings; and
   etching the underlying layer using the blocking portions and the second domain as etch barrier to form fourth openings that extend from the third openings into the underlying layer,
   wherein each of the second openings has a width less than a minor axis width of each of the first openings.

2. The method of claim 1, wherein the second openings are provided between the first peripheral patterns which are adjacent to the guide pattern.

3. The method of claim 1,
   wherein each of the second openings has a width less than 1.5 times a width of each of the first domains, and
   wherein the second openings are dummy patterns and the second openings are not transferred to the underlying layer due to the blocking portions while the fourth openings are formed.

4. The method of claim 1,
   wherein each of the second openings has a width insufficient for phase separation of the block copolymer layer to occur, and
   wherein the second openings are dummy patterns and the second openings are not transferred to the underlying layer due to the presence of the blocking portions while the fourth openings are formed.

5. The method of claim 1, wherein at least two first domains are formed in each of the first openings while the block copolymer layer is annealed.

6. The method of claim 1, wherein forming the guide pattern and the first peripheral patterns includes:
   obtaining a layout for the fourth openings array;
   obtaining a layout for the first openings array from the layout for the fourth openings array, the layout for the first openings array includes a part of the fourth openings; and
   inserting a layout for the second openings to the layout for the first openings array, the second openings are adjacent to the first openings.

7. The method of claim 1, wherein a region including the first peripheral pattern and the second openings are transferred to a second peripheral pattern in the underlying layer while the fourth openings are formed.

8. The method of claim 1,
   wherein the block copolymer layer includes first polymer blocks and second polymer blocks which can be phase-separated by an annealing process, and
   wherein, upon annealing, the first polymer blocks form the first domain, and the second polymers form the second domain.

9. The method of claim 1, wherein the second domain has a concave shape and surrounds a sidewall and a bottom surface of the first domain.

10. The method of claim 9, wherein forming the fourth openings includes:
    removing a bottom portion of the second domain exposed by the third openings to expose the underlying layer, and
    removing the exposed underlying layer.

11. A method of forming patterns, the method comprising:
    forming a guide pattern and first peripheral patterns over an underlying layer, the guide pattern being formed to provide first openings, the first peripheral patterns being formed to provide second openings and a fifth opening, wherein the fifth opening is an alignment key;
    aligning the guide pattern and the underlying layer using the fifth opening;
    forming a block copolymer layer filling the first, the second, and the fifth openings;
    annealing the block copolymer layer to form blocking portions in the second and fifth openings and to form at least one first domain and a second domain in each of the first openings, wherein the second domain surrounds the first domain;
    selectively removing the first domain to form third openings; and
    etching the underlying layer using the blocking portions and the second domain as etch barriers to form fourth openings that extend from the third openings into the underlying layer.

12. The method of claim 11, wherein the fifth opening has a width which is less than a minor axis width of the first openings.

13. The method of claim 11,
wherein the fifth opening has a width less than 1.5 times a width of the first domain, and
wherein the fifth opening is a dummy pattern and a shape of the fifth opening is not transferred to the underlying layer due to the presence of the blocking portions while the fourth openings are formed.

14. The method of claim 11,
wherein the fifth opening has a width insufficient for phase separation of the block copolymer layer to occur, and
wherein the fifth opening is a dummy pattern and a shape of the fifth opening is not transferred to the underlying layer due to the presence of the blocking portions while the fourth openings are formed.

15. The method of claim 11, wherein the fifth opening is an overlay key or an alignment key.

16. The method of claim 11, wherein forming the guide pattern and the first peripheral patterns includes:
    obtaining a layout for the fourth openings array;
    obtaining a layout for the first openings array from the layout for the fourth openings array, the layout for the first openings array includes a part of the fourth openings;
    inserting a layout for the second openings to the layout for the first openings array, the second openings are adjacent to the first openings;
    inserting a layout for the fifth openings to the layout for the first openings array, the fifth openings are adjacent to the second openings; and
    defining a region to form a second peripheral pattern, the region includes the second openings, the fifth openings and the first peripheral patterns.

17. The method of claim 11, wherein the second domain has a concave shape and surrounds sidewalls and a bottom surface of the first domain.

18. The method of claim 17, wherein forming the fourth openings includes:
    removing a bottom portion of the second domain exposed by the third openings to expose the underlying layer; and
    removing the exposed underlying layer.

19. A method of forming patterns, the method comprising:
    forming a guide pattern and first peripheral patterns over an underlying layer, the guide pattern being formed to provide first openings, the first peripheral patterns being formed to provide a fifth opening;
    aligning the guide pattern with the underlying layer using the fifth opening;
    forming the block copolymer layer filling the first and fifth openings;
    annealing the block copolymer layer to provide a blocking portion in the fifth opening and to form at least one first domain and a second domain in each of the first openings, wherein the second domain surrounds the first domain;
    selectively removing the first domain to form third openings; and
    etching the underlying layer using the blocking portion and the second domains as etch barriers to form fourth openings that extend from the third openings into the underlying layer.

* * * * *